United States Patent
Kitagawa et al.

(10) Patent No.: US 6,713,817 B2
(45) Date of Patent: Mar. 30, 2004

(54) SEMICONDUCTOR INTEGRATED CIRCUIT SYSTEM

(75) Inventors: Nobutaka Kitagawa, Machida (JP); Ken Tanabe, Kawasaki (JP)

(73) Assignee: Kabushiki Kaisha Toshiba (JP)

( * ) Notice: Subject to any disclaimer, the term of this patent is extended or adjusted under 35 U.S.C. 154(b) by 281 days.

(21) Appl. No.: 10/004,077

(22) Filed: Oct. 30, 2001

(65) Prior Publication Data

US 2002/0063296 A1 May 30, 2002

(30) Foreign Application Priority Data

Oct. 31, 2000 (JP) ........................................ 2000-333580

(51) Int. Cl.[7] .............................................. H01L 23/62
(52) U.S. Cl. ...................... 257/360; 257/409; 257/491; 361/56
(58) Field of Search ................................ 257/356, 390, 257/315, 322, 355, 360, 409

(56) References Cited

U.S. PATENT DOCUMENTS

| | | | |
|---|---|---|---|
| 5,760,445 A | | 6/1998 | Diaz |
| 5,998,299 A | * | 12/1999 | Krishnan .................... 438/694 |
| 6,091,114 A | * | 7/2000 | Mogul et al. ............... 257/360 |
| 6,600,176 B2 | * | 7/2003 | Noguchi ..................... 257/173 |
| 2002/0000579 A1 | * | 1/2002 | Aoyama ..................... 257/211 |
| 2002/0094625 A1 | * | 7/2002 | Hashimoto et al. ......... 438/200 |

FOREIGN PATENT DOCUMENTS

| | | |
|---|---|---|
| JP | 6-61440 | 3/1994 |
| JP | 8-97416 | 4/1996 |
| JP | 9-283638 | 10/1997 |
| JP | 11-186502 | 7/1999 |

OTHER PUBLICATIONS

Wolf, Stanley, "Silicon Processing for the VLSI Era, vol. 2: Process Integration," p. 443, (1990).
Decision of Rejection mailed on Jun. 26, 2003 corresponding to Taiwanese Patent Application No. 090125755 filed on Oct. 18, 2001.

* cited by examiner

*Primary Examiner*—Amir Zarabian
*Assistant Examiner*—Khanh Dvong
(74) *Attorney, Agent, or Firm*—Gray Cary Ware & Freidenrich, LLP

(57) ABSTRACT

A semiconductor integrated circuit system includes first and second semiconductor devices formed on a substrate and required to have properties the same as each other in operation. The first and second semiconductor devices respectively includes first and second channel regions arranged in a surface of the substrate, and first and second gate electrodes disposed on the first and second channel regions via gate insulating films. A relaxing structure is arranged to reduce fluctuations in the properties of the first and second semiconductor devices, the fluctuations being caused by the electrical effects of plasma when a plasma process is performed. The relaxing structure includes first and second short-circuiting elements respectively connected to the first and second wiring layers and equivalent to each other. The first and second short-circuiting elements are configured to short-circuit the first and second gate electrodes with the first and second channel regions, respectively.

20 Claims, 5 Drawing Sheets

SEMICONDUCTOR INTEGRATED CIRCUIT SYSTEM

CROSS-REFERENCE TO RELATED APPLICATIONS

This application is based upon and claims the benefit of priority from the prior Japanese Patent Application No. 2000-333580, filed Oct. 31, 2000, the entire contents of which are incorporated herein by reference.

BACKGROUND OF THE INVENTION

1. Field of the Invention

The present invention relates to a semiconductor integrated circuit system including a plurality of semiconductor devices, which are required to have properties substantially the same as each other in operation and, more particularly, to a system, which solves a problem caused by fluctuations in the properties of the semiconductor devices due to the electrical effects of plasma when a plasma process is performed for manufacturing the system. When an integrated circuit system including transistors of the MIS(Metal-Insulator-Semiconductor) type, which is represented by the MOS (Metal-Oxide-Semiconductor) type, is manufactured, the properties of transistors are affected by electrical charge stresses appearing in the wiring layers due to a plasma process. In this respect, for example, Jpn. Pat. Appln. KOKAI Publication No. 8-97416, "Semiconductor Device", (Prior Art 1) explains as follows:

2. Description of the Related Art

When a layer is subjected to patterning by plasma etching in a manufacturing process, particles electrically charged by plasma are accumulated on the patterned layer. Accordingly, the patterned layer, such as a metal wiring layer of aluminum, comes into a charged-up state. Where the wiring layer is connected through a contact hole to the gate electrode of a transistor, made of poly-crystalline silicon or the like, electrical charges on the charged-up wiring layer flow into the gate electrode. As a result, a surge voltage is applied to a gate insulating film, e.g., an oxide film, between the gate electrode and a channel region therebelow. It follows that the gate insulating film suffers a stress, by which the gate insulating film is degraded or broken down. This phenomenon depends on a ratio of the surface area of the wiring layer charged with electricity during plasma etching, relative to the surface area of the gate insulating film; which is called "antenna ratio".

In the first stage of degradation or breakdown of a gate insulating film, which is caused by a surge stress brought about the plasma electrical charges, the gate insulating film comes to easily trap hot carriers, thereby increasing the threshold voltage of the transistor. In the second stage of degradation or breakdown of a gate insulating film, a leakage current flows between the gate electrode and the substrate or the source/drain regions.

The Prior Art 1 discloses that plasma damage, such as fluctuation in Vth (threshold voltage), decrease in gm (transconductance), gate leakage current, and gate breakdown, is caused, depending on the plasma processing time, antenna ratio (the ratio of a wiring surface area (circumferential length) relative to a gate surface area (circumferential length)), and so forth. The Prior Art 1 also discloses a countermeasure for preventing variation in plasma damage to a gate insulating film due to the antenna ratio. FIG. 11 is a circuit diagram showing this conventional countermeasure. As shown in FIG. 11, the wiring that connects a preceding internal circuit 202 to the gate electrode of a MOS transistor 204 in a logic circuit is provide with diode elements 206 and resistor elements 208.

Jpn. Pat. Appln. KOKAI Publication No. 6-61440, "Integrated Circuit Device, Data Processing Method In Integrated Circuit Device, And Data Processing Device Of Integrated Circuit Device", (Prior Art 2), discloses another countermeasure for preventing variation in plasma damage to a gate insulating film due to the antenna ratio. FIG. 12 is a circuit diagram showing this conventional countermeasure. As shown in FIG. 12, the gate electrodes of two MOS transistors 214a and 214b disposed in an inverter cell 212 are connected to diode elements 218 disposed in a protection circuit cell 216.

BRIEF SUMMARY OF THE INVENTION

According to a first aspect of the present invention, there is provided a semiconductor integrated circuit system comprising:

a semiconductor substrate;

first and second semiconductor devices formed on the substrate and required to have properties substantially the same as each other in operation, the first and second semiconductor devices respectively including first and second channel regions arranged in a surface of the substrate, and first and second gate electrodes disposed on the first and second channel regions via gate insulating films;

first and second wiring layers connected to the first and second the gate electrodes, respectively; and a relaxing structure configured to relax fluctuation in the properties of the first and second semiconductor devices, the fluctuation being caused by electrical effects of plasma when a plasma process is performed for manufacturing the system, wherein the relaxing structure comprises first and second short-circuiting elements respectively connected to the first and second wiring layers and substantially equivalent to each other, the first and second short-circuiting elements being configured to short-circuit the first and second gate electrodes with the first and second channel regions, respectively, when the first and second wiring layers are supplied with electrical potentials beyond operation ranges of electrical potentials, which are applied to the first and second gate electrodes in the operation of the first and second semiconductor devices, respectively.

According to a second aspect of the present invention, there is provided a semiconductor integrated circuit system comprising:

a semiconductor substrate;

first and second semiconductor devices formed on the substrate and required to have properties substantially the same as each other in operation, the first and second semiconductor devices respectively including first and second channel regions arranged in a surface of the substrate, and first and second gate electrodes disposed on the first and second channel regions via gate insulating films;

first and second wiring layers connected to the first and second the gate electrodes, respectively; and a relaxing structure configured to reduce fluctuations in the properties of the first and second semiconductor devices, the fluctuations being caused by electrical effects of plasma when a plasma process is performed for manufacturing the system, wherein the relaxing structure comprises metal wiring layers forming the first and second wiring layers, derived from a metal film at a lowest level and disposed on the substrate via an insulating film, the second wiring layer is shorter than the first wiring layer, and is connected to a dummy wiring layer derived from the metal film at the lowest level, and the dummy wiring layer is sized such that the first and second gate electrodes are affected by the electrical effects of plasma to substantially the same extent as each other when a plasma process is performed for manufacturing the system.

DETAILED DESCRIPTION OF THE INVENTION

Figure 11:
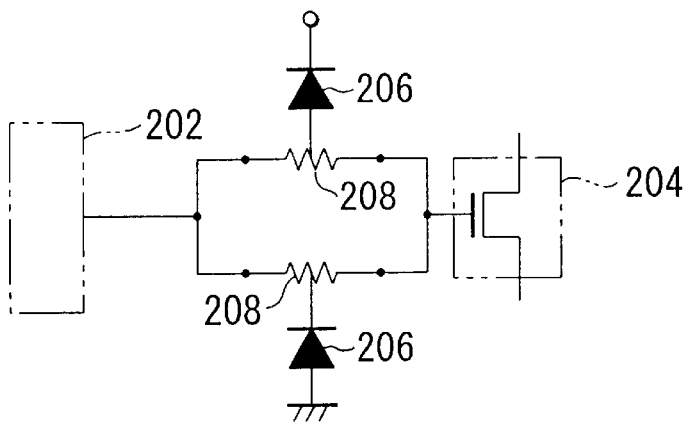
FIG. 11 is a circuit diagram showing a conventional countermeasure against plasma damage.
Figure 12:
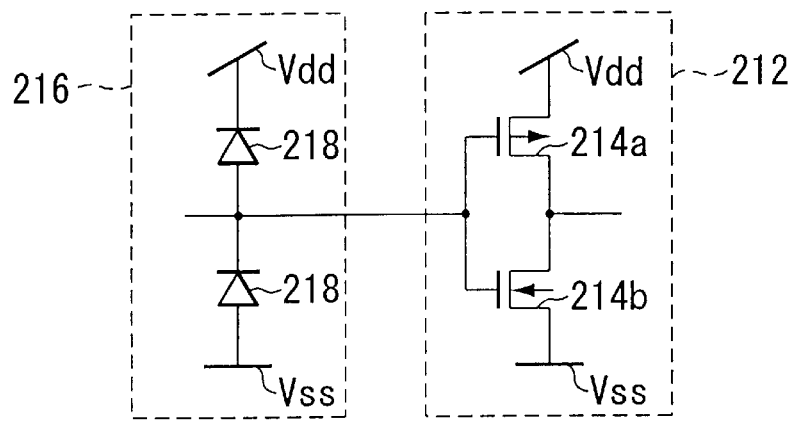
FIG. 12 is a circuit diagram showing another conventional countermeasure against plasma damage.

In the process of developing the present invention, the present inventors conducted research on problems of the conventional countermeasures against plasma damage to a gate insulating film, as described with reference to FIG. 11 (Prior Art 1) and FIG. 12 (Prior Art 2). As a result, the present inventors obtained the following findings.

The countermeasures shown in the Prior Arts 1 and 2 are intended to protect a MOS transistor of an inverter circuit and so forth employed in a logic circuit, and to reduce the ill effects on its operation speed. Accordingly, these countermeasures can reduce the influence of fluctuations in the Vth of the logic circuit upon the operation speed, standby current, and so forth. However, these countermeasures are not related in any way to the effects on the properties of analog circuits.

Specifically, the Prior Art 1 discloses that antenna ratio-related Vth fluctuations deteriorate the performance in operation speed relative to a logic gate, and can cause the system to erroneously operate, and there is a countermeasure against it, in which the gate is provided with diode elements and resistor elements connected thereto. However, the Prior Art 1 does not disclose any countermeasure for pair transistors employed in analog circuits. The Prior Art 2 discloses that, where wiring is rendered to have an antenna ratio larger that a preset value, a diode cell is added by an automatic design CAD. However, Prior Art 2 does not disclose any countermeasure for MOS transistors employed in analog circuits, which are required to have a good pair-ship. Accordingly, the countermeasures disclosed in the Prior Arts 1 and 2 cannot be effective countermeasures by themselves for the offset voltage of an operational amplifier circuit or the current ratio of a current mirror circuit, which is employed in high-precision analog circuits.

Figure 13:
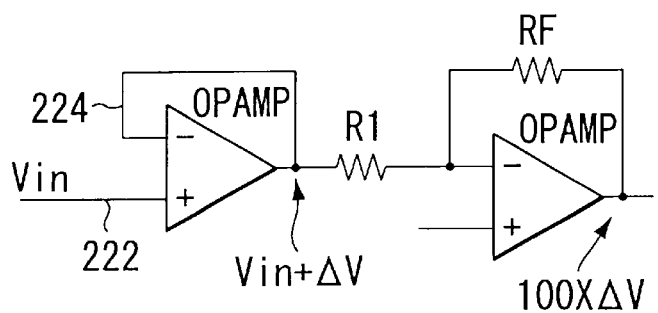
FIG. 13 is a circuit diagram for explaining problems in relation to plasma damage in an operational amplifier circuit.

FIG. 13 is a circuit diagram for explaining problems in relation to plasma damage in an operational amplifier circuit. This operational amplifier circuit OPAMP includes MOS transistors for differential input, wherein a wiring line 222 connected to the transistor on the positive input (non-inverted input) side is longer than a wiring line 224 connected to the transistor on the negative input (inverted input) side. Accordingly, the gate insulating film of the MOS transistor on the positive input side suffers an antenna ratio larger than that the gate insulating film of the MOS transistor on the negative input side suffers. In this case, even where a diode is connected to the gate electrode of the transistor on the positive input side as a plasma damage countermeasure, the Vth of the transistor on the negative input side can fluctuate, though it may be slight, thereby causing an unbalance between the threshold voltages Vth of the two transistors. The difference caused in the Vth becomes an input offset voltage of the operational amplifier circuit OPAMP as it is. For example, in the case of amplification of 100 times, a difference of 10 mV in the Vth is magnified to 0.1V, which appears as an output error.

Figure 14:
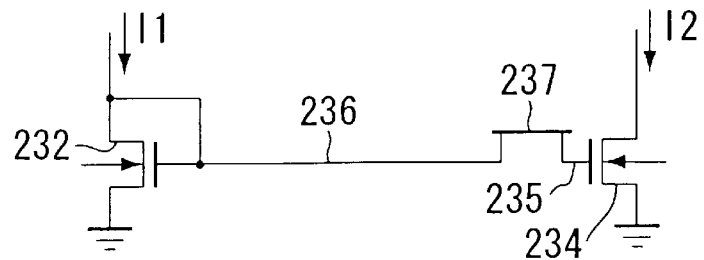
FIG. 14 is a circuit diagram for explaining problems in relation to plasma damage in a MOS current mirror circuit.

FIG. 14 is a circuit diagram for explaining problems in relation to plasma damage in a MOS current mirror circuit. The MOS current mirror circuit includes MOS transistors 232 and 234 on the bias voltage generating side and the bias voltage receiving side, respectively, wherein a wiring line 233 at the first level connected to the gate electrode of the transistor 232 is longer than a wiring line 235 at the first level connected to the gate electrode of the transistor 234. The wiring lines 233 and 235 are connected to each other by a wiring line 237 at the second level. Accordingly, when a wiring metal film of the first level is etched, the gate insulating film of the transistor 232 suffers an antenna ratio larger than that the gate insulating film of the transistor 234 suffers. As a result, the difference between the wiring lines 233 and 235 brings about a difference in the threshold voltages Vth of the transistors 232 and 234 due to plasma damage.

Particularly, in the case of a low operation-current circuit, in which currents I1 and I2 flowing through the transistors are small, a design is adopted such that the Vgs (gate-source voltage) is reduced to a range of from about several tens mV to several hundreds mV, relative to the Vth. Where Vgs= 1.0V and Vth=0.85V, and a decrease of 50 mV in the Vth is caused only in the transistor 232, the following influence is caused. Specifically, on the basis of the relationship I=β× (Vgs−Vth)$^2$, the currents I1 and I2 come to be $(1-0.8)^2$= 0.04, and $(1-0.85)^2$=0.0225, respectively, thereby creating a current difference of 1.78 (0.04/0.0225) times.

Furthermore, the Prior Arts 1 and 2 do not pay any attention to the fact that the final wiring pattern shape of wiring layers is not the sole factor determining the antenna ratio. Specifically, when a metal film used as the material of wiring layers is deposited, all the wiring layers are short-circuited, and as the metal film is being etched, a large antenna ratio may be locally brought about. For example, a portion between a wiring layer connected to a gate electrode and an adjacent wiring pattern is etched, the etching proceeds less uniformly, depending on various conditions, such as wiring layer distance, wiring layer density (covering ratio), and wiring shape. This allows the wiring layer connected to the gate electrode to temporarily have a large antenna ratio during the etching.

When a via structure, which comprises a via hole and a via plug, is formed to connect upper and lower metal wiring layers to each other, electrical charges generated by a plasma process in a resist layer and an inter-level insulating film concentrate on the via structure. Consequently, where the density of via structures is low, a gate insulating film may suffer a stronger stress; which is indicated in IEDM 9, pp. 679 to 741 (Publication 1).

Some embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

<First Embodiment>

Figure 1:
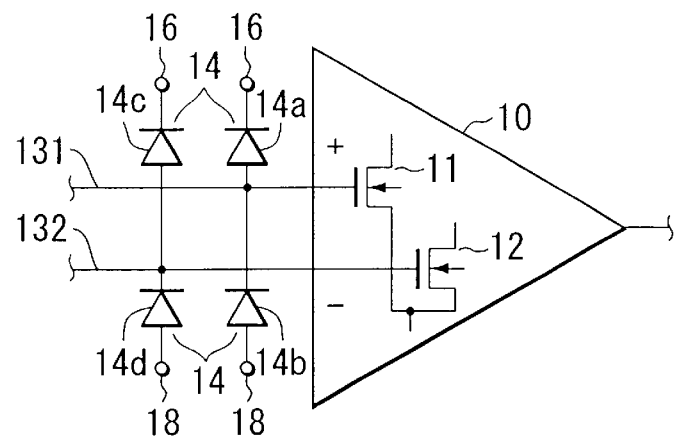
FIG. 1 is a circuit diagram showing an operational amplifier circuit, which is a MOS-type semiconductor integrated circuit system according to a first embodiment of the present invention.

FIG. 1 is a circuit diagram showing an operational amplifier circuit, which is a MOS-type semiconductor integrated circuit system according to a first embodiment of the present invention. The operational amplifier circuit 10 includes NMOS transistors 11 and 12 on the positive input side and the negative input side, respectively, for forming a differential pair, which are required to have properties substantially the same as each other in operation. Wiring lines 131 and 132 are connected to the gate electrodes of the transistors 11 and 12.

Diodes 14a and 14b are connected to the wiring line 131, while diodes 14c and 14d are connected to the wiring line 132. The diodes 14a and 14c are used as short-circuiting elements substantially equivalent to each other, and connected to the wiring lines 131 and 132, respectively, from power supply nodes 16 in the forward direction. Similarly, the diodes 14b and 14d are used as short-circuiting elements substantially equivalent to each other, and connected to the wiring lines 131 and 132, respectively, from substrate bulk nodes 18 in the forward direction.

The diodes 14a to 14d function as part of a relaxing structure, which suppresses fluctuation in properties of the transistors 11 and 12 caused by the electrical effects of plasma when a plasma process is performed for manufacturing the system. Specifically, the diodes 14a to 14d are designed such that the channel regions of the transistors 11 and 12 are respectively short-circuited with their gate electrodes, through the diodes 14a to 14d, when the wiring lines 131 and 132 receive electrical potentials, which do not fall in the ranges of electrical potentials applied to the gate electrodes of the transistors 11 and 12 in operation.

Figure 2A:
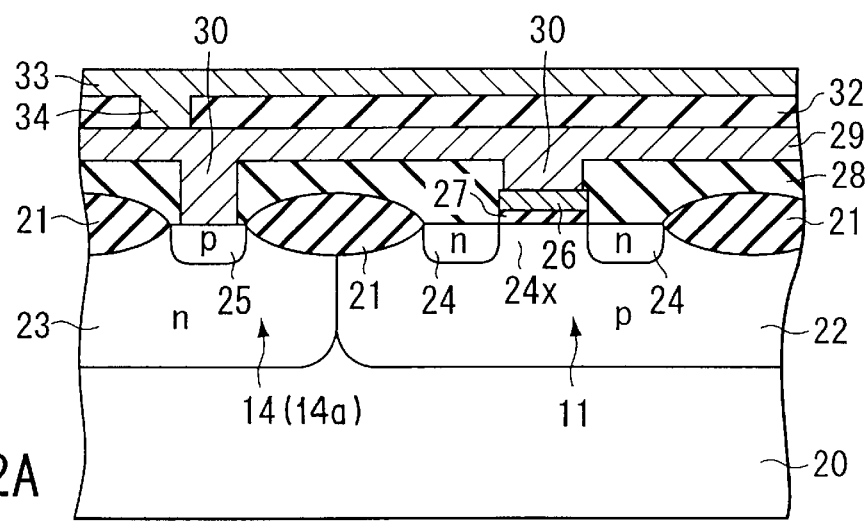
FIGS. 2A and 2B are sectional views respectively showing sectional structures, each including the transistor, wiring, one diode, and so forth.

The transistors 11 and 12 and their protection structures are structurally equivalent to each other between the transistors 11 and 12. Accordingly, an explanation will be given of the structure of only one transistor side. FIG. 2A is a sectional view showing an example of the sectional structure including the transistor 11, wiring line 131, diode 14 (14a), and so forth.

For example, a p-well 22 and an n-well 23 are formed adjacent to each other in the surface of a semiconductor substrate 20 of p-silicon. Device isolation regions 21 are formed on the surface of the substrate 20 at certain intervals, such as a position between the wells 22 and 23. A pair of n-diffusion layers 24 are formed to sandwich a surface region 24x in the surface of the p-well 22. The n-diffusion layers 24 and the surface region 24x function as the source/drain regions and the channel region of the NMOS transistor 11, respectively. A p-diffusion layer 25 is formed in the surface of the n-well 23. The interface between the p-diffusion layer 25 and the n-well 23 forms the PN junction of the diode 14.

A gate electrode 26 made of, e.g., doped polycrystalline silicon is disposed on the channel region 24x through a gate insulating film 27. The surface of the semiconductor substrate 20 is covered with a first inter-level insulating film 28, on which a first metal wiring layer 29 used as the wiring line 131 or 132 (see FIG. 1) is disposed. The metal wiring layer 29 is covered with a second inter-level insulating film 32, on which a second metal wiring layer 33 is disposed.

The first metal wiring layer 29 is formed by subjecting a wiring metal film made of, e.g., aluminum at the lowest level or first level to patterning by plasma etching. The first metal wiring layer 29 is connected to the gate electrode 26 of the transistor 11 and the p-diffusion layer 25 of the diode 14 by contact plugs 30, which penetrate the first inter-level insulating film 28. The second metal wiring layer 33 is formed by subjecting a wiring metal film made of, e.g., aluminum at the second-to-bottom level or second level to patterning by plasma etching. The second metal wiring layer 33 is connected to the first metal wiring layer 29 by a via plug 34, which penetrates the second inter-level insulating film 28 at a position out of the range between the gate electrode 26 and p-diffusion layer 25.

An explanation will be given of a manufacturing process of the structure shown in FIG. 2A.

First, the field oxide films 21 are selectively formed on the main surface of the p-semiconductor substrate 20. Then, the p-well 22 and the n-well 23 are formed in the region of the substrate 20. Then, the gate insulating film 27, and the gate electrode 26 made of, e.g., polycrystalline silicon are sequentially formed on the surface of the p-well 22. The source/drain regions 24 sandwiching the channel region 24x of the transistor 11 is formed by ion-implanting an n-type impurity into part of the p-well 22, using the gate electrode 26 as a mask. Furthermore, the p-diffusion layer 25 of the diode 14 is formed by ion-implanting a p-type impurity into part of the n-well 23.

Then, the first inter-level insulating film 28 is formed overall, and the contact holes are formed in the film 28 to correspond to the source/drain regions 24, the p-diffusion layer 25, and the gate electrode 26. Then, a wiring metal film made of e.g., aluminum at the lowest level is formed overall to fill the contact holes, and is etched by plasma dry etching to form the metal wiring layer 29.

In the first embodiment, the metal wiring layer 29 comes into direct contact with the gate electrode of the transistor 11 (12) and one of the terminals of the diode 14, e.g., the p-diffusion layer 25. In other words, the diode 14 is directly connected to the metal wiring layer 29, which is in turn connected to the gate electrode of the transistor 11 (12). Accordingly, when the wiring metal film at the lowest level is patterned by plasma etching to form the metal wiring layer 29, the plasma electrical charges on the metal wiring layer 29 are absorbed through the diode 14, and disappear. The positive charge on the metal wiring layer 29 passes through the PN junction of the diode 14 in the forward direction, and passes through the PN junction between the n-well 23 and the p-well 22 in the reverse direction, so that it is absorbed in the substrate (p-well 22).

In other words, if an electrical potential beyond the operation potential range is applied to the metal wiring layer 29 upon plasma etching, the metal wiring layer 29 and the channel region 24x are short-circuited with each other through the PN junction of the diode 14. Consequently, the gate insulating film 27 is prevented from receiving an excessive surge voltage from the plasma, thereby suppressing generation of plasma damage. Particularly, since the set of diodes 14a and 14b connected to the transistor 11, and the set of diodes 14c and 14d connected to the transistor 12 are arranged as short-circuiting elements substantially equivalent to each other, fluctuations in the Vth of the transistors 11 and 12 caused by the plasma are substantially the same as each other. As a result, a satisfactory pair-ship is realized between the transistors 11 and 12 for differential input.

Figure 2B:
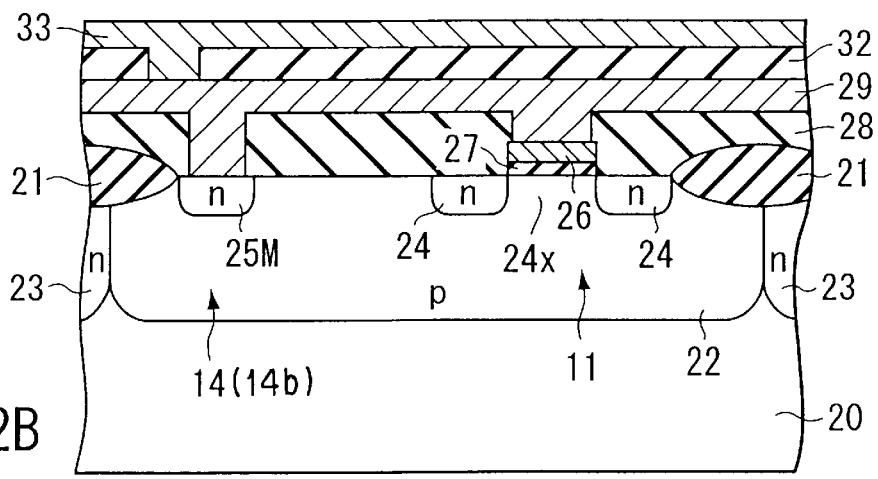

FIG. 2B is a sectional view showing another example of the sectional structure including the transistor 11, wiring line 131, diode 14 (14b), and so forth. In this example, an n-diffusion layer 25M is formed in the surface of a p-well 22, so that the interface between the n-diffusion layer 25M and the p-well 22 forms the PN junction of the diode 14. In other words, the PN junction of the diode 14 functioning as a short-circuiting element and the channel region 24x of the transistor 11 (12) are arranged in the common well 22. The PN junction is arranged to receive a reverse bias by an electrical potential applied to the gate electrode 26 of the transistor 11 (12) in operation.

In the structure shown in FIG. 2B, the positive charge on the metal wiring layer 29 passes through the PN junction of the diode 14 in the reverse direction, so that it is absorbed in the substrate (p-well 22). The negative charge on the metal wiring layer 29 passes through the PN junction of the diode 14 forward, so that it is absorbed in the substrate (p-well 22). In this case, the surface area of the PN junction to receive a reverse bias should be sufficiently large.

Also in the structure shown in FIG. 2B, if an electrical potential beyond the operation potential range is applied to the metal wiring layer 29 upon plasma etching, the metal wiring layer 29 and the channel region 24x are short-circuited with each other through the PN junction of the diode 14. Consequently, the gate insulating film 27 is prevented from receiving an excessive surge voltage from the plasma, thereby suppressing generation of plasma damage. Furthermore, the structure shown in FIG. 2B allows the metal wiring layer 29 and the channel region 24x to be reliably short-circuited with each other, thereby protecting the gate insulating film 27.

The structure shown in FIG. 1 includes the two diodes 14a and 14b (14c and 14d) connected to each wiring line 131 (132) to release both the positive and negative charges in the forward direction. However, since the reverse electric charge can be released, depending on the reverse breakdown voltage of the diode (PN junction), a single diode suffices for each wiring line 131 (132). In this case, the direction of the single diode is determined on the basis of the polarity and influence of electrical charges. In order to increase the reverse bias current, it is preferable to sufficiently enlarge the surface area of the PN junction of the diode.

The features of this embodiment can be applied to the case where PMOS transistors are used for the differential input pair in an operational amplifier circuit. Specifically, in this case, in accordance with the structure shown in FIGS. 2A and 2B, the gate electrode of a PMOS transistor and a diode formed in a substrate are directly connected to each other by a metal wiring layer. With this arrangement, it is possible to prevent the influence of an electrical charge stress occurring in the metal wiring layer during a plasma process, and to realize a satisfactory pair-ship of transistors for differential input.

It is not preferable that the protection PN junction (diode 14) is not directly connected to a metal wiring layer at the first level or lowest level, but is connected to a metal wiring layer at the second level. Because, in this case, the gate insulating film of the transistor is not protected by the protection PN junction, when a wiring metal film at the first level is patterned, or a via structure is formed thereafter. Accordingly, the protection PN junction is preferably arranged such that it is directly connected to a metal wiring layer 29 at the first level.

Figure 3:
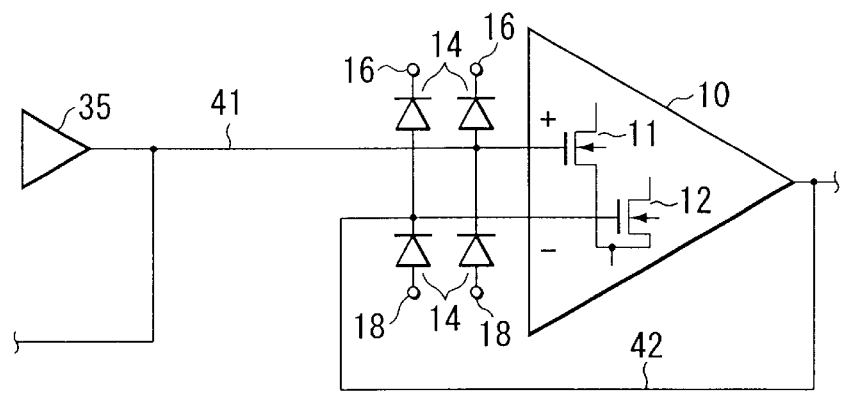
FIG. 3 is a circuit diagram showing a voltage follower circuit employing the operational amplifier circuit shown in FIG. 1.

FIG. 3 is a circuit diagram showing a voltage follower circuit for converting the impedance of outer signals, which employs the operational amplifier circuit 10 shown in FIG. 1. Generally, a wiring line 41 on the positive input side (+) of the operational amplifier circuit 10 is longer and extends over more on a substrate, as compared to a wiring line 42 on the negative input side (−). For example, in the structure shown in FIG. 3, the wiring line 41 is connected to a terminal of another circuit 35 formed on the same substrate, while the wiring line 42 is connected to the output terminal of the operational amplifier circuit 10. On the other hand, in the case of an inversion amplifier circuit frequently used as an analog amplifier circuit, a wiring line on the negative input side is generally long and extends around on a substrate, similarly to a wiring line on the positive input side. Where the lengths of wiring lines differ from each other between the positive input side and the negative input side, the gate electrodes of transistors are affected by the electrical effects of plasma different from each other between the two sides.

Furthermore, wiring lines used in analog circuits generally have a complicated structure utilizing a branch wiring layer, a metal wiring layer at the second level or at a level above the second level, and so forth, depending on complication in circuit or layout. Such a complicated structure also causes the gate electrodes of transistors to be affected by the electrical effects of plasma different from each other between the positive input side and the negative input side.

As described above, in general, the positive input side and the negative input side of analog circuits have wiring conditions different from each other, and thus the two sides are affected by the electrical effects of plasma different from each other. However, as described with reference to FIGS. 1 to 2B, where wiring lines connected to transistors are provided with short-circuiting elements substantially identical with each other between the positive input side and the negative input side, fluctuations in the Vth of the transistors caused by plasma become less different from each other.

<Second Embodiment>

Figure 4:
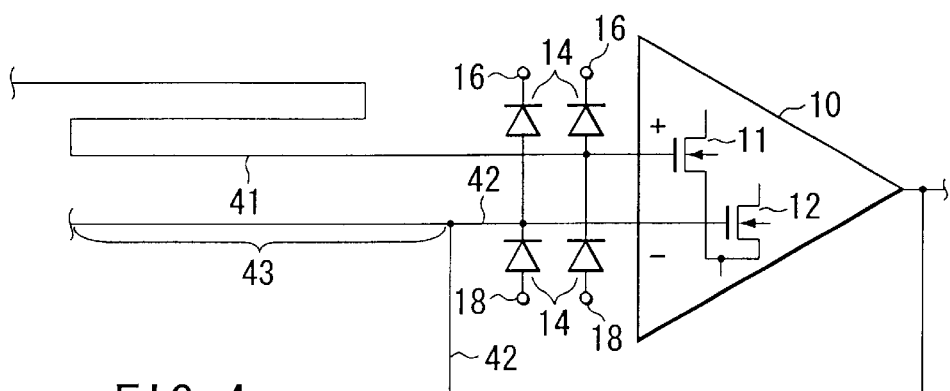
FIG. 4 is a circuit diagram showing a voltage follower circuit employing an operational amplifier circuit, which is a MOS-type semiconductor integrated circuit system according to a second embodiment of the present invention.

FIG. 4 is a circuit diagram showing a voltage follower circuit employing an operational amplifier circuit, which is a MOS-type semiconductor integrated circuit system according to a second embodiment of the present invention. Also in the circuit shown in FIG. 4, a wiring layer or line 41 on the positive input side (+) is longer than a wiring layer or line 42 on the negative input side (−). The shorter wiring line 42 is connected to a dummy wiring layer or line 32, which is formed by patterning a wiring metal film at the lowest level (first level) common to the wiring lines 41 and 42. The dummy wiring line 32 is sized such that the gate electrodes of transistors on the positive input side and the negative input side are substantially similarly affected by the electrical effects of plasma.

Dummy wiring can be utilized to unify the conditions on the positive input side and the negative input side, not only for the metal wiring lines 41 and 42 at the first level, but also for other matters of multi-layer metal wiring structures, such as upper and lateral surface areas of wiring, and via structures. With this arrangement, the electrical effects of plasma on the positive input side and the negative input side become less different, and thus the gate electrodes of transistors on both sides are preferably affected by the electrical effects of plasma to substantially the same extent as each other. Furthermore, combining this feature of the second embodiment with the feature of the first embodiment, i.e., short-circuiting elements, it is possible to realize pair transistors with fluctuations, which are small and substantially the same as each other, in their properties.

<Third Embodiment>

Where a multi-layer metal wiring structure is used for a transistor, a metal wiring layer connected to the gate electrode of the transistor may be then connected to a metal wiring layer at an upper level by a via structure. In this case, when the via hole of the via structure is formed in an inter-level insulating film by plasma etching, a fluctuation in the properties of the transistor may be caused to a great extent. Accordingly, where a wiring structure excluding any via structure is used as wiring connected to the gate electrode, it is possible to prevent damage from being caused in the transistor.

Figure 5:
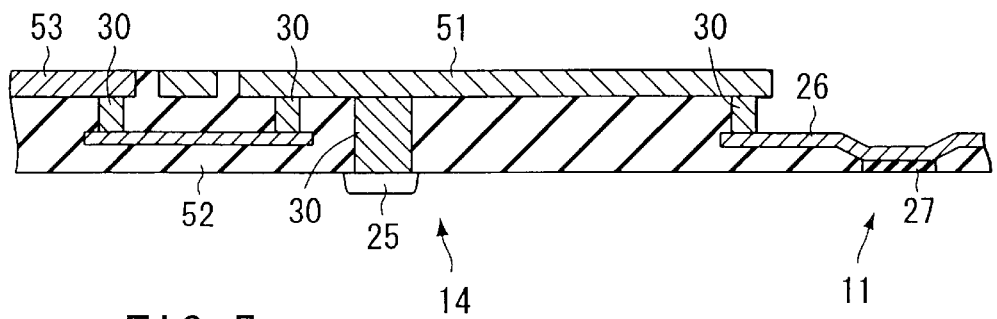
FIG. 5 is a sectional view showing a metal wiring layer, which connects a diode used as a short-circuiting element to the gate electrode of a transistor incorporated in an operational amplifier circuit according to a third embodiment of the present invention.

FIG. 5 is a sectional view showing a metal wiring layer, which connects a diode used as a short-circuiting element to the gate electrode of a transistor incorporated in an operational amplifier circuit according to a third embodiment of the present invention. In FIG. 5, the gate electrode 26 of a transistor 11 is connected to the diffusion layer 25 of a diode by a metal wiring layer 51 at the first level. The metal wiring layer 51 is connected to a signal input node of the operational amplifier circuit by a non-metal wiring layer 52 at a level below the first level and another metal wiring layer 53 at the first level. The non-metal wiring layer 52 is formed by patterning a doped polycrystalline silicon film common to the wiring layer 52 and the gate electrode 26. The metal wiring layer 53 is formed by patterning a wiring metal film at the first level common to the wiring layer 53 and the metal wiring layer 51. The metal wiring layers 51 and 53 are connected to the non-metal wiring layer 52 by contact plugs 30 derived from the wiring metal film at the first level.

Specifically, the metal wiring layer 51 connected to the gate electrode 26 of the transistor and the diffusion layer 25 of the diode is electrically isolated from any metal wiring layer at a level above the first level. Where the metal wiring layer 51 is not connected to any metal wiring layer at an upper level by a via structure, it is possible to prevent plasma damage from being caused in the gate insulating film when the via structure is formed.

<Fourth Embodiment>

Figure 6:
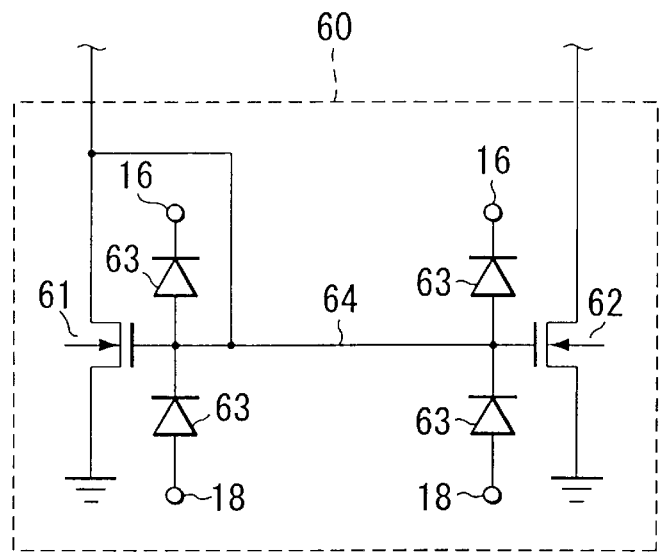
FIG. 6 is a circuit diagram showing a current mirror circuit, which is a MOS-type semiconductor integrated circuit system according to a fourth embodiment of the present invention.

FIG. 6 is a circuit diagram showing a current mirror circuit, which is a MOS-type semiconductor integrated circuit system according to a fourth embodiment of the present invention. The current mirror circuit 60 includes a MOS transistor 61 on the side for generating a bias voltage, and a MOS transistor 62 on the side for receiving the bias voltage. The gate electrodes of the transistors 61 and 62 are connected to each other by a wiring line 64, to which diodes 63 formed on a substrate common to the transistors 61 and 62 are connected. The wiring line 64 is formed by patterning a wiring metal film at the lowest level (first level). The transistor 61 has a diode connection in which the drain and the gate are connected to each other. Accordingly, where the metal wiring line 64 at the first level is directly connected to the gate electrode and the drain region of the transistor 61, the diodes 63 is connected to the transistor 61.

In the structure shown in FIG. 6, even where the metal wiring connected to the gates of the pair transistors 61 and 62 of the current mirror circuit 60 is complicated, it is possible to remove the ill effects of an electrical charge stress occurring in the metal wiring line due to a plasma process. Since the transistors 61 and 62 ensure a satisfactory pair-ship, a current ratio can be realized with high accuracy.

The gate electrodes of the transistors 61 and 62 may be connected to respective metal wiring lines or layers at the same level, derived from a common wiring metal film. In this case, as in the first embodiment, short-circuiting elements (diodes 63) substantially identical with each other can be respectively and directly connected to the metal wiring layers. If only the gate electrode of the transistor 61 is provided with a diode 63, a large fluctuation in the Vth may be caused by a plasma stress only in the transistor 62. As a result, the bias voltage shifts, so a fluctuation in current is caused in the transistor 62.

<Fifth Embodiment>

Where portions in a wiring pattern have different wiring conditions, such as density, distance, and covering ratio, plasma etching tends to proceed less uniformly, though it depends on process conditions. When a wiring metal film is deposited and a resist layer is formed, the wiring metal film entirely covers a substrate. Since the wiring metal film is patterned by plasma etching, a large antenna ratio is brought about during the etching without reference to the antenna ratio determined by the completed wiring shape.

For example, a large antenna ratio is caused where a wiring layer connected to a gate electrode is separated from an adjacent wiring layer at a late timing. In this case, the gate insulating film below the gate electrode may be greatly damaged by plasma. The problem is caused only where the adjacent wiring layer is not short-circuited with the substrate. In contrast, where the adjacent wiring layer is short-circuited with the substrate, the adjacent wiring layer can be rather utilized to prevent plasma damage, as described later.

In either case, where first and second transistors are required to have properties substantially the same as each other in operation, wiring distances are preferably arranged to be substantially the same as each other between the first and second transistors. More specifically, where wiring layers at the first level connected to the gate electrodes of the respective transistors are adjacent to other wiring layers at first level, it is preferable to set the wiring distance between the wiring layer connected to the gate electrode and the adjacent wiring layer in the first transistor to be substantially the same as the corresponding distance in the second transistor.

Figure 7A:
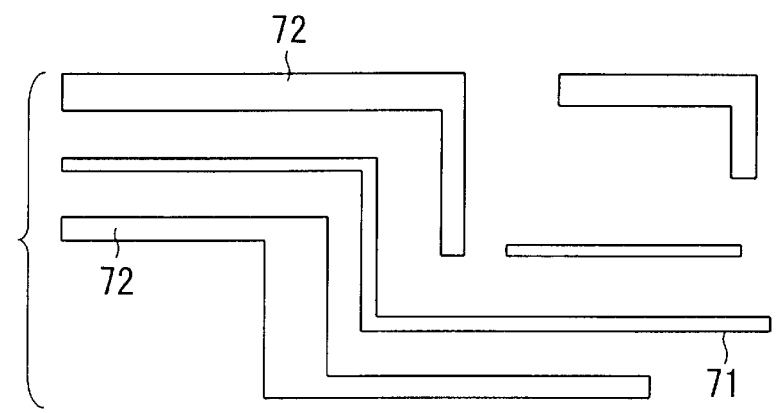
FIGS. 7A and 7B are plan views respectively showing wiring structures employed in an operational amplifier circuit, which is a MOS-type semiconductor integrated circuit system according to a fifth embodiment of the present invention.
Figure 7B:
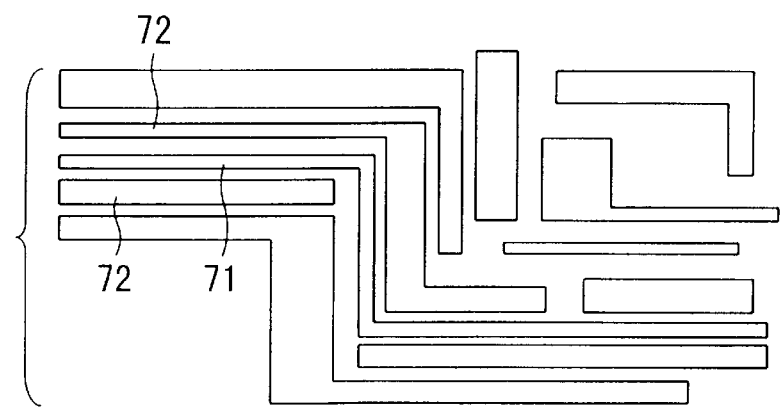

FIGS. 7A and 7B are plan views respectively showing wiring structures employed in an operational amplifier circuit, which is a MOS-type semiconductor integrated circuit system according to a fifth embodiment of the present invention. In FIGS. 7A and 7B, a metal wiring layer 71 is connected to the gate electrode (sensitive gate) of a transistor, which is sensitive to fluctuation in the properties, and a diode used as a short-circuiting element. The distance between the metal wiring layer 71 and an adjacent wiring layer 72 at the same level is larger than the minimum distance according to the wiring rule, or their wiring pattern density is set lower (the covering ratio in this area is lower than the others).

With this arrangement, when a wiring metal film is being etched by a plasma process, the wiring layer 71 is swiftly separated from the adjacent wiring layer 72. Accordingly, the wiring layer 71 is isolated from the wiring layer 72 earlier than separation between the wiring layers having the minimum distance, thereby preventing the wiring layer 71 from suffering a high antenna ratio.

Figure 8A:
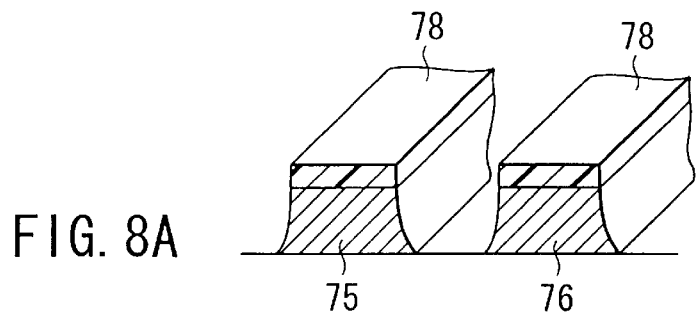
FIG. 8A is a perspective and sectional view showing a state where wiring distance is expanded in accordance with the fifth embodiment.
Figure 8B:
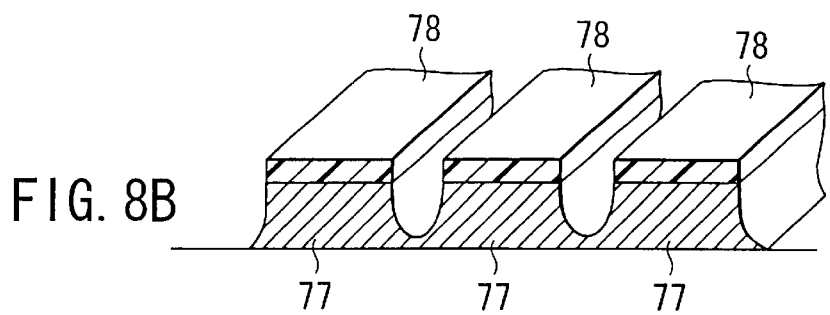
FIG. 8B is a perspective and sectional view showing a state where wiring distance is not expanded.

FIG. 8A is a perspective and sectional view showing a state where wiring distance is expanded in accordance with the fifth embodiment, and FIG. 8B is a perspective and sectional view showing a state where wiring distance is not expanded. As shown in FIGS. 8A and 8B, the distance between wiring layers 75 and 76 is wider than that between wiring layers 77. The wiring layers 75 to 77 are separated from each other by etching, using a resist pattern 78 as a mask. Comparing these distances, it is understood that separation timing of the wiring layers during etching of the wiring metal film depends on the wiring distance and density.

<Sixth Embodiment>

Figures 9A, 9B:
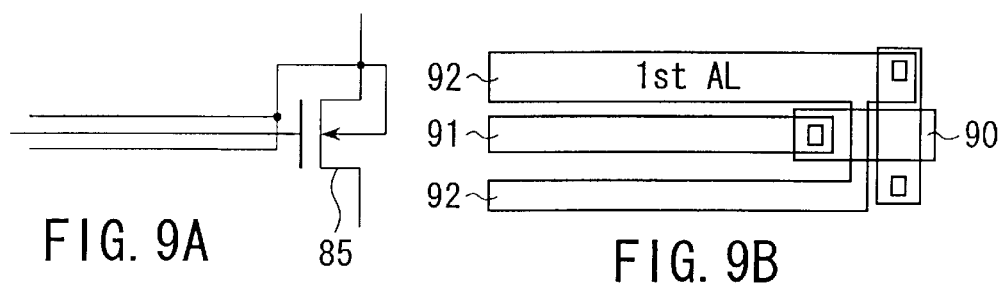
FIGS. 9A and 9B are a circuit diagram and a plan view, respectively, showing a wiring structure of an operational amplifier circuit, which is a MOS-type semiconductor integrated circuit system according to a sixth embodiment of the present invention.

FIGS. 9A and 9B are a circuit diagram and a plan view, respectively, showing a wiring structure of an operational amplifier circuit, which is a MOS-type semiconductor integrated circuit system according to a sixth embodiment of the present invention. In FIGS. 9A and 9B, a metal wiring layer 91 is connected to the gate electrode 90 of a MOS transistor 85 and a diode (not shown) used as a short-circuiting element. The metal wiring layer 91 is adjacent to other metal wiring layers 92 at the first level (1st Al) in common. The metal wiring layer 92 is connected to the substrate (bulk) of the transistor 85 by a contact plug, which is formed in a step prior to formation of the wiring layers 91 and 92.

In this case, contrary to the structure shown in FIGS. 7A to 8B, the distance between the wiring layer 91 and the adjacent wiring layer 92 is set narrower than that between other wiring layers. With this arrangement, the gate electrode 90 and the channel region of the transistor 85 keep short-circuited with each other from a time of deposition of a wiring metal film at the first level to a time late in plasma etching. Consequently, hardly any plasma damage is caused in the gate insulating film of the transistor 85. Note that, also in this case, since the first and second transistors are required to have properties substantially the same as each other in operation, it is preferable to set the wiring distance between the wiring layer 91 and the adjacent wiring layer 92 in the first transistor to be substantially the same as the corresponding distance in the second transistor.

<Seventh Embodiment>

There is a case where a metal wiring layer, which is directly connected to the gate electrode of a transistor and a diode, is connected to a metal wiring layer at an upper level (generally a metal wiring layer at the second level) by a via structure. In this case, when plasma etching is performed to form the via structure, electrical charges applied on the metal wiring layer may cause plasma damage to the gate insulating film of the transistor.

Figure 10:
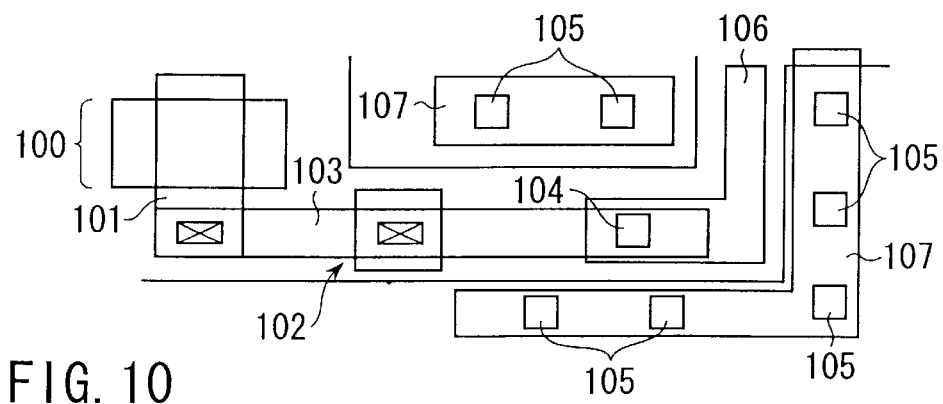
FIG. 10 is a plan view showing a wiring structure of an operational amplifier circuit, which is a MOS-type semiconductor integrated circuit system according to a seventh embodiment of the present invention.

FIG. 10 is a plan view showing a wiring structure of an operational amplifier circuit, which is a MOS-type semiconductor integrated circuit system according to a seventh embodiment of the present invention. In FIG. 10, a metal wiring layer 103 is directly connected to the gate electrode 101 of a transistor 100 and a diode 102 used as a short-circuiting element. The metal wiring layer 103 is connected to a metal wiring layer 106 at an upper level by a first via plug 104. The metal wiring layer 106 is adjacent to wiring layers 107 at the same level, which are provided with a plurality of second via plugs 105 disposed around the first via plug 104.

In this case, it is preferable to increase the covering ratio with the via plugs 105 connected to the wiring layers 107 and disposed around the via plug 104, which connects the metal wiring layer 103 directly connected to the gate electrode 101 to the upper metal wiring layer 106. With this arrangement, when the via plugs 104 and 105 are formed by a resist process including a plasma process, the via plug 104 is prevented from gathering electrical charges. In this case, it is effective to connect all or some of the second via plugs 105 to a power source wiring line or a ground wiring line.

The features of the above-described embodiments do not have to be applied together at the same time, but may be arbitrarily combined on the basis of degrees of deteriorations caused in the properties of transistors. For example, where an offset voltage of several tens mV does not cause any substantial problem in an operational amplifier circuit, it suffices if only diodes are added. Where an offset voltage should be not more than 10 mV, a wiring pattern without entailing any via plugs can be adopted as a sole countermeasure. Where Vth fluctuation should be not more than several mV, some of the countermeasures, e.g., relating to metal wiring distances or densities, and via covering ratios can be combined with each other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit system comprising:
   a semiconductor substrate;
   first and second semiconductor devices formed on the substrate and required to have properties substantially the same as each other in operation, the first and second semiconductor devices respectively including first and second channel regions arranged in a surface of the substrate, and first and second gate electrodes disposed on the first and second channel regions via gate insulating films;

first and second wiring layers connected to the first and second the gate electrodes, respectively; and a relaxing structure configured to relax fluctuation in the properties of the first and second semiconductor devices, the fluctuation being caused by electrical effects of plasma when a plasma process is performed for manufacturing the system, wherein the relaxing structure comprises first and second short-circuiting elements respectively connected to the first and second wiring layers and substantially equivalent to each other, the first and second short-circuiting elements being configured to short-circuit the first and second gate electrodes with the first and second channel regions, respectively, when the first and second wiring layers are supplied with electrical potentials beyond operation ranges of electrical potentials, which are applied to the first and second gate electrodes in the operation of the first and second semiconductor devices, respectively.

2. The system according to claim 1, wherein the first and second semiconductor devices are transistors on positive and negative input sides, respectively, employed in an operational amplifier circuit.

3. The system according to claim 1, wherein the first and second semiconductor devices are, respectively, a transistor that generates a bias voltage and a transistor that receives the bias voltage, employed in a current mirror circuit.

4. The system according to claim 1, wherein the first and second short-circuiting elements respectively comprise first and second PN junctions formed in the surface of the substrate, which respectively intervene between the first and second wiring layers and the first and second channel regions.

5. The system according to claim 4, wherein the first PN junction and the first channel region are disposed in a first well in common, and the second PN junction and the second channel region are disposed in a second well in common.

6. The system according to claim 4, wherein the first and second PN junctions are parts of diodes.

7. The system according to claim 4, wherein the first and second PN junctions are arranged to receive reverse biases by electrical potentials, which are applied to the first and second gate electrodes in the operation of the first and second semiconductor devices, respectively.

8. The system according to claim 1, wherein the first and second wiring layers respectively comprise metal wiring layers derived from a metal film at a lowest level and disposed on the substrate via an insulating film, between the first gate electrode and the first short-circuiting element, and between the second gate electrode and the second short-circuiting element.

9. The system according to claim 8, wherein the metal wiring layers are electrically isolated from any metal wiring layers derived from a metal film above the lowest level.

10. The system according to claim 8, wherein the first and second wiring layers respectively further comprise non-metal wiring layers derived from a non-metal film, from which the first and second gate electrodes are derived, and the non-metal film is interposed between the substrate and the metal film at the lowest level.

11. The system according to claim 8, wherein the first and second wiring layers are adjacent to first and second adjacent wiring layers derived from the metal film at the lowest level, and a first distance between the first wiring layer and the first adjacent wiring layer is substantially the same as a second distance between the second wiring layer and the second adjacent wiring layer.

12. The system according to claim 11, wherein the first and second adjacent wiring layers are short-circuited with the substrate, and the first and second distances are smaller than a distance between other wiring layers derived from the metal film at the lowest level.

13. The system according to claim 11, wherein the first and second adjacent wiring layers are not short-circuited with the substrate, and the first and second distances are larger than a distance between other wiring layers derived from the metal film at the lowest level.

14. The system according to claim 8, wherein the second wiring layer is shorter than the first wiring layer, and is connected to a dummy wiring layer derived from the metal film at the lowest level, and the dummy wiring layer is sized such that the first and second gate electrodes are affected by electrical effects of plasma to substantially the same extent as each other when a plasma process is performed for manufacturing the system.

15. The system according to claim 8, wherein each of the first and second wiring layers is connected to a wiring layer derived from an upper metal film by a via plug disposed at a connecting position, and a plurality of via plugs are disposed to surround the connecting position and to short-circuit another wiring layer derived from the upper metal film with the substrate.

16. A semiconductor integrated circuit system comprising:

a semiconductor substrate;

first and second semiconductor devices formed on the substrate and required to have properties substantially the same as each other in operation, the first and second semiconductor devices respectively including first and second channel regions arranged in a surface of the substrate, and first and second gate electrodes disposed on the first and second channel regions via gate insulating films;

first and second wiring layers connected to the first and second the gate electrodes, respectively; and a relaxing structure configured to reduce fluctuations in the properties of the first and second semiconductor devices, the fluctuations being caused by electrical effects of plasma when a plasma process is performed for manufacturing the system, wherein the relaxing structure comprises metal wiring layers forming the first and second wiring layers, derived from a metal film at a lowest level and disposed on the substrate via an insulating film, the second wiring layer is shorter than the first wiring layer, and is connected to a dummy wiring layer derived from the metal film at the lowest level, and the dummy wiring layer is sized such that the first and second gate electrodes are affected by the electrical effects of plasma to substantially the same extent as each other when a plasma process is performed for manufacturing the system.

17. The system according to claim 16, wherein the first and second wiring layers are adjacent to first and second adjacent wiring layers derived from the metal film at the lowest level, and a first distance between the first wiring layer and the first adjacent wiring layer is substantially the same as a second distance between the second wiring layer and the second adjacent wiring layer.

18. The system according to claim 17, wherein the first and second adjacent wiring layers are short-circuited with the substrate, and the first and second distances are smaller than a distance between other wiring layers derived from the metal film at the lowest level.

19. The system according to claim 17, wherein the first and second adjacent wiring layers are not short-circuited with the substrate, and the first and second distances are larger than a distance between other wiring layers derived from the metal film at the lowest level.

20. The system according to claim 16, wherein the metal wiring layers are electrically isolated from any metal wiring layers derived from a metal film above the lowest level.

* * * * *